United States Patent [19]
Ruffner

[11] Patent Number: 5,911,858
[45] Date of Patent: Jun. 15, 1999

[54] METHOD FOR HIGH-PRECISION MULTI-LAYERED THIN FILM DEPOSITION FOR DEEP AND EXTREME ULTRAVIOLET MIRRORS

[75] Inventor: Judith Alison Ruffner, Albuquerque, N.M.

[73] Assignee: Sandia Corporation, Albuquerque, N.M.

[21] Appl. No.: 08/801,883

[22] Filed: Feb. 18, 1997

[51] Int. Cl.$^6$ ................................................. C23C 14/34
[52] U.S. Cl. .............................. 204/192.27; 204/192.13; 204/192.15; 204/192.23
[58] Field of Search ........................ 204/192.13, 192.15, 204/192.23, 192.26, 192.27, 192.28

[56] References Cited

U.S. PATENT DOCUMENTS

| | | | |
|---|---|---|---|
| 4,684,565 | 8/1987 | Abeles et al. . | |
| 4,845,041 | 7/1989 | Scuitto et al. | 436/172 |
| 4,858,556 | 8/1989 | Siebert | 118/664 |
| 5,003,567 | 3/1991 | Hawryluk et al. | 378/34 |
| 5,362,552 | 11/1994 | Austin | 428/216 |
| 5,433,988 | 7/1995 | Fukuda et al. | 428/141 |
| 5,513,039 | 4/1996 | Lu et al. | 359/584 |
| 5,535,056 | 7/1996 | Caskey et al. | 359/603 |
| 5,551,587 | 9/1996 | Keppel et al. | 216/24 |

OTHER PUBLICATIONS

Semiconductor Industry Association, *The National Technology Roadmap for Semiconductors,* pp. 81–93 (1994).
S. P. Vernon, M. J. Carey, D. P. Gaines, and F. J. Weber, Multilayer Coatings for the EUV Lithography Front–End Test Bed, OSA Proceedings on Extreme Ultraviolet Lithography, Monterey, CA, vol. 23, pp. 33–40 (Sep. 19–21, 1994).
D. L. Windt and W. K. Waskiewicz, Multilayer Facilitates Required for Extreme–Ultraviolet Lithography, J. Vac. Sci. Technol. B, vol. 12(6), pp. 3826–3832 (Nov./Dec. 1994).
Michael Hibbs, Roderick Kunz, Mordechai Rothschild, 193–nm Lithography at MIT Lincoln Lab, Solid State Technology, pp. 69–78 (Jul. 1995).
Semiconductor Lithography for the Next Millennium, IEEE Spectrum, pp. 33–38 (Apr. 1996).
J. Siebert, PVD–300 Multi–Source Sputtering System Brochure released by Unifilm Technology, Boulder, Co. (1992).
Eberhard Spiller, Alan E. Rosenbluth, Determination of Thickness Errors and Boundary Roughness from the Measured Performance of Multilayer Coating, Optical Engineering, vol. 25(8), pp. 954–963 (Aug. 1986).
Eberhard Spiller, Appl. Phys. Let., Low–Loss Reflection Coatings Using Absorbing Materials, vol. 20, pp. 365–367 (1972).
D. G. Stearns, R. S. Rosen, S. P. Vernon, Fabrication of High–Reflectance Mo–Si Multilayer Mirrors by Planar–Magnetron Sputtering, J. Vac. Sci. Technol. A., vol. 9(5), pp. 2662–269 (Sep./Oct. 1991).
D. G. Stearns, R. S. Rosen, and S. P. Vernon, Multilayer Mirror Technology for Soft–x–ray Projection Lithography, Applied Optics, vol. 32(34), pp. 6952–6960 (Dec. 1993).

(List continued on next page.)

*Primary Examiner*—Nam Nguyen
*Assistant Examiner*—Steven H. Ver Steeg
*Attorney, Agent, or Firm*—Elmer A. Klavetter

[57] ABSTRACT

A method for coating (flat or non-flat) optical substrates with high-reflectivity multi-layer coatings for use at Deep Ultra-Violet ("DUV") and Extreme Ultra-Violet ("EUV") wavelengths. The method results in a product with minimum feature sizes of less than 0.10-$\mu$m for the shortest wavelength (13.4-nm). The present invention employs a computer-based modeling and deposition method to enable lateral and vertical thickness control by scanning the position of the substrate with respect to the sputter target during deposition. The thickness profile of the sputter targets is modeled before deposition and then an appropriate scanning algorithm is implemented to produce any desired, radially-symmetric thickness profile. The present invention offers the ability to predict and achieve a wide range of thickness profiles on flat or figured substrates, i.e., account for $1/R^2$ factor in a model, and the ability to predict and accommodate changes in deposition rate as a result of plasma geometry, i.e., over figured substrates.

28 Claims, 8 Drawing Sheets

OTHER PUBLICATIONS

D.L. Windt, R. Hull, and W.K. Waskiewicz, Interface Imperfections in Metal/Si Multilayers, J. Appl. Phys., vol. 71(6), pp. 2675–2678 (Mar. 1992).

David L. Windt, XUV Optical Constants of Single–Crystal GaAs and Sputtered C, Si, $Cr_3$, $C_2$, Mo, and W, Applied Optics, vol. 30(1), pp. 15–25 (Jan. 1991).

D. A. Tichenor et al., 10x Reduction Imaging at 13.4 nm, OSA Proceedings on Extreme Ultraviolet Lithography, vol. 23, pp. 89–97 (1994).

D. A. Tichenor et al., Progress in the Development of EUV Imaging Systems, Sandia National Laboratories, 7 pages.

D. A. Tichenor et al., Recent results in the development of an integrated EUVL laboratory $_{13}$ tool, Electron–Beam, X–Ray, EUV, and Ion–Beam Submicrometer Lithographs for Manufacturing V, SPIE, vol. 2437, pp. 292–307 (1995).

D.A. Tichenor et al., Extreme ultraviolet lithography for circuit fabrication at 0.1 $\mu$m feature size, Applications of Laser Plasma Radiation II, SPIE, vol. 2523, pp. 23–28 (1995).

Ted Agres, IC Density Growth Rate is Key Issue for Industry, R&D Magazine, pp. 20–32 (Jun. 1996).

A. E. Rosenbluth, Computer search for layer materials that maximize the reflectivity of X–ray multilayers, Revue Phys. Appl. vol. 23, pp. 1599–1621 (Oct. 1988).

D. G. Stearns, The Scattering of x–rays from nonideal multilayer structures, J. Appl. Phys., vol. 65, pp. 491–506 (Jan. 1989).

R. Goeke, A. V. Farnsworth, C. C. Neumann, W. C. Sweatt, M. E. Warren, J. W. Weed, *Near Perfect Optics*, Sand96–1367 UC–910, Jun. 1996.

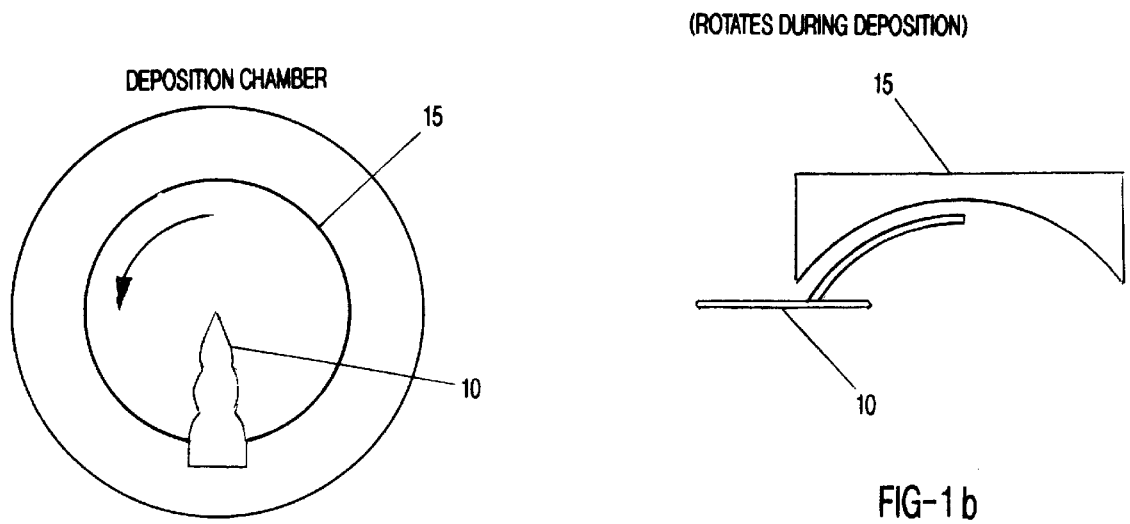
FIG-1a
FIG-1b
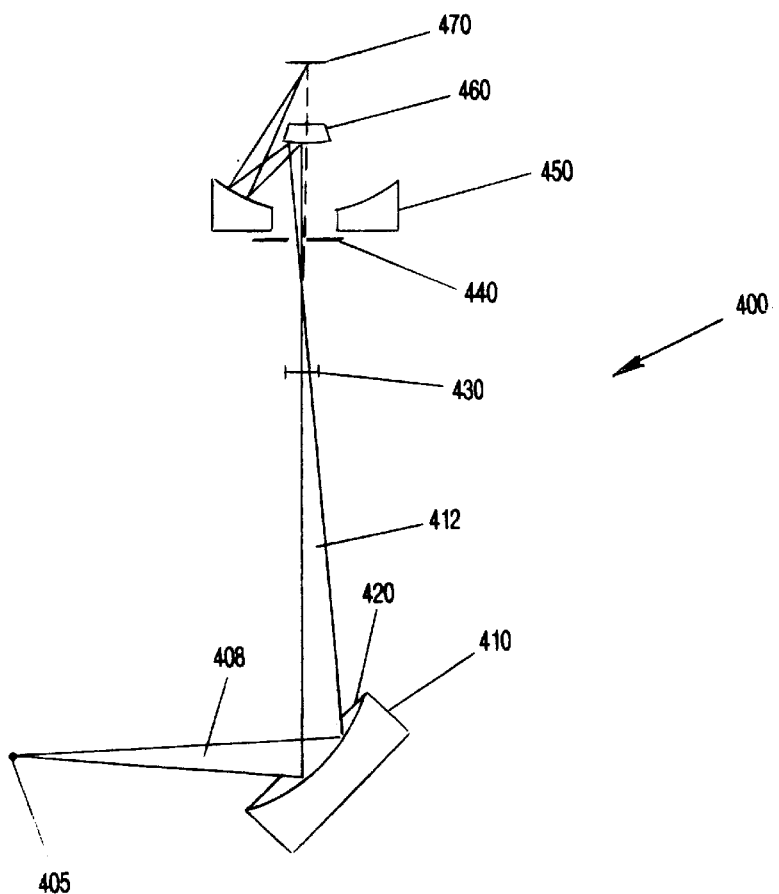
FIG-2

STEP 100: DETERMINE OPTIMUM DEPOSITION PARAMETERS FOR BOTH DEPOSITION TARGETS AND CALIBRATE THEIR THICKNESS DEPOSITION PROFILES AND DEPOSITION RATES.

STEP 110: PERFORM AN ADEQUATE PRE-SPUTTER OF BOTH DEPOSITION TARGETS.
STEP 120: DETERMINE THE OPTIMUM DEPOSITION PRESSURE.
STEP 130: WHERE APPROPRIATE, USE DC POWER FOR BOTH DEPOSITION TARGETS TO MAXIMIZE PLASMA STABILITY.
STEP 140: DETERMINE THE OPTIMUM DEPOSITION RATE.
STEP 150: CALIBRATE THICKNESS DEPOSITION PROFILES FOR BOTH THIN FILM MATERIALS USING COMPUTER-DRIVEN CALIBRATION PROGRAM.
STEP 160: SPUTTER DEPOSITION THIN FILMS OF BOTH MATERIALS AND MEASURE ACTUAL THICKNESS AND UNIFORMITY FOR COMPARISON OF ACTUAL/SPECIFIED THICKNESS, AND IMPLEMENT SCALE FACTOR FOR SUBSEQUENT DEPOSITIONS.

STEP 200: MODEL DESIRED THICKNESS DEPOSITION PROFILES FOR BOTH DEPOSITION TARGETS.

STEP 210: PROVIDE "PARKING" POSITIONS AND TIMES TO THE CO-DEPOSITION PROGRAM TO PRODUCE HIGHLY-UNIFORM COATINGS.
STEP 220: ACCOUNT FOR REQUIRED THICKNESS GRADIENT OF THIN FILMS ON FIGURED (NON-FLAT) SUBSTRATES.
    STEP 222: MAINTAIN CONSTANT PHASE SHIFT.
    STEP 224: ACCOUNT FOR $1/R^2$ DEPENDENCE.

STEP 300: DEPOSIT THIN FILM LAYERS USING CO-DEPOSITION PROGRAM ACCORDING TO CALIBRATION AND MODELING PROGRAMS. BEGIN DEPOSITING MATERIAL WITH LOW INDEX OF REFRACTION AND THEN DEPOSIT MATERIAL WITH HIGH INDEX REFRACTION.

STEP 400: CHARACTERIZE MULTI-LAYERED MIRRORS FABRICATED.

STEP 410: USE X-RAY REFLECTOMETRY AND MODEL RESULTS TO DETERMINE: (1) THE BI-LAYER PERIOD, (2) THE THICKNESS OF EACH MATERIAL LAYER, AND (3) THE AVERAGE INTERFACIAL ROUGHNESS. MODELING THE RESULTS ALSO ENABLES DETECTION OF A DECOUPLED SIGNAL THAT IS CAUSED BY VARIATIONS IN LAYER THICKNESSES.
STEP 420: CHARACTERIZE A NUMBER OF DIFFERENT POINTS ON THE OPTICAL SUBSTRATE TO ASSESS THICKNESS GRADIENT ACCURACY.
STEP 430: USE RESULTS FROM STEPS 410 AND 420 TO OPTIMIZE DEPOSITION TIMES AND THICKNESS PROFILES USED TO DEPOSIT THE LAYERS IN STEP 300.
STEP 440: CHARACTERIZE ULTIMATE REFLECTANCE OF OPTIMIZED MULTI-LAYERED MIRROR USING AN APPROPRIATE RADIATION SOURCE.

FIG-6

METHOD FOR HIGH-PRECISION MULTI-LAYERED THIN FILM DEPOSITION FOR DEEP AND EXTREME ULTRAVIOLET MIRRORS

GOVERNMENT RIGHTS

This invention was made with United States Government support under Contract No. DE-AC04-94AL85000 awarded by the U.S. Department of Energy. The Government has certain rights in this invention.

CROSS-REFERENCE TO RELATED APPLICATIONS

Not applicable.

BACKGROUND OF THE INVENTION

The present invention relates generally to the field of lithography and multi-layered flat or figured mirrors for use in lithography systems. More specifically, the present invention relates to a method of coating flat and figured optical substrates with high-reflectivity multi-layer coatings for use at Deep Ultra-Violet ("DUV") and Extreme Ultra-Violet ("EUV") wavelengths.

In general, lithography refers to processes for pattern transfer between various media. Lithography is a technique used for integrated circuit ("IC") fabrication in which a silicon slice, the wafer, is coated uniformly with a radiation-sensitive film, the resist, and an exposing source (such as light, X-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Currently, there are a number of advanced lithography processes that use either steppers or proximity printers to produce state-of-the-art commercially-available products. Electron beam photolithography, on the other hand, is used almost exclusively by researchers developing ultra-small minimum feature size ("mfs") semiconductor processes, basic research, or low-volume radiation-hardened military integrated circuits. Use of electron beam photolithography for large-scale commercial applications such as semiconductor processing is not practical because the electron beam can damage the underlying circuit and the defect free masks have not been reproducible.

Proximity X-ray lithography uses a 1:1 transmission mask in conjunction with X-ray radiation to project a pattern onto a photoresist. The very short wavelength of the X-ray radiation results in the possibility for very high resolutions, e.g., mfs less than or equal to 0.1-$\mu$m. However, the 1:1 transmission masks required for this technology are extremely difficult to fabricate and maintain. The lack of a projection (demagnification) process means that features on the mask, must be the same size as the desired feature size on the wafer (0.1-$\mu$m). In addition, proximity lithography suffers from other problems such as distortion of a thin membrane mask, misalignment between the mask and wafer, and resolution degradation caused by secondary photoelectrons radiating from the silicon base plate.

Electron beam and ion projection lithographies use electrons and ions respectively to project a pattern onto a photoresist. The particles have very high energies and are able to efficiently expose the photoresist. The particles are focused using electromagnetic lenses similar to those used in transmission electron microscopes. Presently, both technologies suffer from technical problems that must be overcome for the technology to become viable. Electron beam and ion projection lithographies require new column designs to minimize the column interaction and space charge impact on resolution. In addition, both technologies require the development of membrane masks with the appropriate magnification factor.

Phase shifting reticle projection photolithography technology uses special masks and coherent laser light to produce images for a mfs on the order of 0.1-$\mu$m. This process requires high power light and long exposure times making the photolithography process susceptible to vibrations. The vibrations can introduce distortions into the photoresist which result in defects in the IC and consequently reduce the yield of the photolithography process. In addition to a reduced product yield, phase shifting projection photolithography systems are expensive compared to traditional projection lithography systems. However, the phase shifting projection photolithography systems are preferred to electron beam photolithography systems because they are less expensive, safer, and require less space in a cleanroom. Because of the high cost, low yield, low reliability, and low volume throughput, phase shifting projection photolithography is used primarily by researchers developing ultra-small mfs semiconductor processes and basic research. These systems suffer from fundamental limitations that restrict their usefulness in the volume production photolithography market.

Present DUV photolithography systems use refractive optical systems (lenses) with 248-nm radiation to create mfs of less than or equal to 0.4-$\mu$m. As future generation photolithography systems move to progressively shorter wavelengths, the performance and lifetime of lenses will decline as a result of increased optical absorption of the lens materials at these shorter wavelengths. The absorption is already problematic in lenses designed for use at 193-nm in next generation photolithography systems. $SiO_2$ lenses suffer from absorption which leads to optical compaction while $CaF_2$ lenses suffer from stress-induced birefringence. Lenses will be completely useless for subsequent generation photolithography systems designed for use at even shorter wavelengths (<193-nm). Multi-layered, high-reflectance coatings (mirrors) represent the only viable alternative optical elements for the creation of high-speed, reliable, reasonably-priced photolithography systems for use at DUV and EUV wavelengths (193-nm to 13.4-nm).

Projection lithography is a powerful and essential tool for microelectronics processing. As feature sizes are driven smaller and smaller, optical systems are approaching their limits as a function of the wavelengths of the optical radiation. A recognized way of reducing the feature size of circuit elements is to lithographically image them with radiation of a shorter wavelength. The use of EUV radiation (a.k.a., "soft" X-rays) with wavelengths less than or equal to 100-nm is now at the forefront of research in an effort to achieve the desired smaller feature sizes. Indeed, the *National Technology Roadmap for Semiconductors* predicts that, by the year 2010, the mfs will decrease from about 0.35-$\mu$m to 0.07-$\mu$m. Mass production of large-area microchips with feature sizes as small as 0.10-$\mu$m is contemplated with the use of EUV radiation, e.g., at a wavelength of 13.4-nm. EUV radiation, however, has its own problems. The complicated and precise optical lens systems used in conventional projection lithography do not work well for a variety of reasons. Chief among them is the fact that most materials are extremely absorptive and do not make useful lenses at EUV wavelengths. In addition, single surface reflectors (mirrors) offer minimal reflectivity because their refractive indices, N (N=n+ik), have a real component, n, that approaches 1.00 and an imaginary component, k (a.k.a., absorption constant), that is very high for these short wavelengths.

The present state-of-the-art projection lithography for Very Large Scale Integration ("VLSI") is a 16 megabit microchip with circuitry built to design rules of 0.5-$\mu$m mfs. Efforts directed to further miniaturization take the initial form of more fully utilizing the resolution capability of presently-used ultraviolet delineating radiation. Deep Ultra-Violet ("DUV") radiation, wavelength range of 100-nm to 300-nm, with techniques such as phase masking, off-axis illumination, and step-and-repeat, can permit design rules (minimum feature size or space dimension) of 0.25-$\mu$m or slightly smaller. Mass production of large-area microchips with feature sizes as small as 0.1-$\mu$m is contemplated with the use of EUV radiation, e.g., at a wavelength of 13.4-nm.

Two EUV radiation sources are under consideration: a laser plasma source and a synchrotron source. Additionally, a variety of EUV (X-ray) patterning approaches have been considered. Probably the most developed form of X-ray lithography is proximity printing. In proximity printing, the object:image size ratio is necessarily limited to a 1:1 ratio and is produced much in the manner of photographic contact printing. A fine-membrane mask is maintained at one or a few microns spacing or distance from the wafer (i.e., out of contact with the wafer, thus, the term "proximity"), which lessens the likelihood of mask damage but does not eliminate-it. Making perfect masks on a fragile membrane continues to be a major problem. The necessary absence of optics in-between the mask and the wafer necessitates a high level of parallelicity in the incident radiation. Radiation of wavelength $\lambda \leq 1.6$-nm is required for 0.25-$\mu$m or smaller patterning in order to limit diffraction at feature edges on the mask.

Projection lithography has natural advantages over proximity printing. One advantage is that the likelihood of mask damage is greatly reduced. This reduces the costs associated with replacement masks and equipment downtime. Projection lithography enables the use of imaging or camera optics in-between the mask and the wafer which compensate for edge scattering or diffraction and, so, permit use of longer wavelength radiation. The resulting system is known as extreme ultra-violet lithography, or EUVL, a.k.a., soft X-ray projection lithography ("SXPL").

Hawryluk et al., U.S. Pat. No. 5,003,567, describe an approach to soft X-ray projection lithography ("SXPL"), which also takes advantage of recent advances in the field of EUV optics. For example, it is possible to build an EUV reduction camera using curved imaging mirrors, which may be spherical or aspherical. Each mirror includes a substrate of a material such as glass-ceramic or sintered glass having a low coefficient of thermal expansion. The first surface of the substrate is typically ground to high precision and polished, which is then overcoated with a multi-layer coating. The alternating (i.e., paired) materials have a large difference in complex index of refraction at the EUV wavelength being used. As a consequence of the periodic variation of complex index of refraction, the mirror exhibits high EUV radiation reflectivity at certain angles of incidence. A typical EUV reduction camera uses a reflective mask consisting of a thin, IC metallization pattern overlying an EUV-reflective, multi-layer coating on a polished (flat or curved) substrate. The mask is positioned such that EUV radiation incident thereupon is reflected from the mask onto a primary mirror, then onto one or more secondary mirrors, and from the last secondary mirror onto a wafer surface. Image reductions as great as 20:1 have been achieved in this manner. A disadvantage of the Hawryluk et al. design, however, is that it requires a curved, pre-distorted object mask, which is difficult to fabricate accurately and requires the optics to be adapted accordingly.

Available refractive indices are still quite close to one at $\lambda$=10-nm, but are sufficient to permit fabrication of multi-layer reflective optics or Distributed Bragg Reflectors ("DBR"). DBR optics resulting in approximately equal to 60 to 65% reflectance for use with 14-nm radiation have been constructed and used to obtain 0.1-$\mu$m feature sizes. This approach, providing for full-feature (non-scanning), reduction projection is severely limited by field curvature. While needed resolution is obtainable, field size is very small, e.g., 25×50 -$\mu$m with a feature size of 0.1-$\mu$m.

Present photolithography systems use refractive optical systems (lenses) to focus the light and operate at 248-nm radiation (DUV) to create a mfs of less than 0.4-$\mu$m. As future generation photolithography systems move to progressively shorter wavelengths, the performance and life-time of lenses will decline as a result of increased optical absorption of the lens materials at these shorter wavelengths. The absorption is already problematic in lenses designed for use at 193-nm in next generation photolithography systems such as $SiO_2$ (silica) and $CaF_2$ (fluorite). $SiO_2$ lenses suffer from absorption, which leads to optical compaction, while $CaF_2$ lenses suffer from stress-induced birefringence.

$SiO_2$ has an absorption edge approaching 193-nm that causes the lenses to absorb a small but significant portion of the incident radiation. The radiation is converted to heat energy which can cause the $SiO_2$ lens material to recrystallize and undergo optical compaction. The radiation conversion changes the optical properties of the lenses in a significant and permanent manner, drastically altering the focusing capabilities of the optical system. In addition, absorption of the incident radiation results in the formation of defect centers which are highly absorptive themselves. This increase in absorption causes a progressive reduction in transmission as a result of the formation of additional defect centers and a serious degradation of the focusing capabilities as a result of enhanced optical compaction.

$CaF_2$ is less susceptible to these problems because it is less absorptive than $SiO_2$ at 193-nm. However, lenses made from $CaF_2$ suffer from a number of other problems that limit their usefulness. Optical grade $CaF_2$ is extremely expensive, especially for the larger-sized focusing elements required for photolithography optical systems. $CaF_2$ lenses also suffer from localized variations in the refractive index as a result of stress-induced birefringence effects. Localized heating as a result of even moderate absorption or mechanical strain as a result of the weight of the lens element itself may be sufficient to cause significant birefringence in the lens. This significantly degrades the performance of each lens and will limit the useful lifetime of the optical system.

The amount of absorption for both $SiO_2$ and $CaF_2$ lenses increases as the operating wavelength of the optical system is reduced further. In addition, single-surface mirrors become impractical at progressively shorter wavelengths as a result of decreased reflectance. For example, aluminum-coated mirrors offer only 92% reflectance at 193-nm. While 92% reflectance seems like a reasonable high-reflectance value, the total loss in light intensity in an optical system containing, for example, four mirrors will be about 28.4%. The total loss in light intensity is even greater for shorter wavelengths. Therefore, the use of lenses or single-surface mirrors is completely impractical at progressively shorter wavelengths. On the other hand, multi-layered mirrors can now be fabricated that offer greater than 99% reflectance at 193-nm. This results in a total loss in light intensity of only 3.9% for a comparable optical system with four mirrors. For this reason, it is best to design and fabricate highly-reflective multi-layered mirrors for use as focusing elements at these short wavelengths (e.g., 193-nm and 13.4-nm) as in the present invention. Multi-layered, high-reflectance coatings (mirrors) represent the only viable alternative optical elements for the creation of high speed, reliable, reasonably-priced photolithography systems for use at DUV wavelengths such as 193-nm and EUV wavelengths such as 13.4-nm.

Referring to FIGS. 1a and 1b, one technique for coating figured optics, which was developed at AT&T Bell Laboratories, uses a contoured, shaped baffle 10 ("uniformity mask") placed directly in front of the rotating figured optic to control the relative deposition rate across the optic, thus controlling the multi-layer coating thickness profile. See also D. L. Windt and W. K. Waskiewicz, *Multilayer Facilities Required for Extreme-Ultraviolet Lithography*, J. Vac. Sci. Technol. B, 12(6), pp. 3826–3832 (November/December 1994). The shape of the baffle 10 determines the relative deposition rate as a function of position on the optic 15. The appropriate shape of the baffle 10 is determined empirically and requires the deposition and characterization of numerous test mirrors. Any change in the curvature of the optic or the deposition parameters requires yet another set of calibration experiments to redesign the baffle 10. This process is very cumbersome, non-manufacturable, and expensive. Additionally, the effective shape of the baffle 10 changes as it accumulates thin film material from the sputter deposition process over time, which changes the resultant deposition profile on the figured optic 15 over time. Effectively, the use of the baffle deposition process is not practical for commercial applications.

Researchers at Lawrence Livermore National Laboratories have developed a process for coating EUV mirrors in which a rotating figured optic is scanned in a circular path around the entire deposition chamber. S. P. Vernon, M. J. Caroy, D. P. Gaines, and F. J. Weber, *Multilayer Coatings for the EUV Lithography Front-End Test Bed,* OSA Proceedings on Extreme Ultraviolet Lithography, Monterey, Calif., vol. 23, pp. 33–40 (Sep. 19–21, 1994). The optic is continuously rotated at a constant velocity and moved with respect to the sputter source. The effective deposition rate at any point along the circular path is affected by the source-to-optic distance. By changing the velocity of the optic at various points along the circular path, it is possible to control the resultant thickness profile. The thickness is built up at the edges of the optic by reducing the velocity of the optic at certain positions with respect to the target, which can be modeled mathematically. This process has been used successfully to coat a limited number of figured EUV mirrors.

It is expected that effort toward adaptation of EUV sources and optics for EUVL will continue. Multi-layered, high-reflectance coatings (mirrors) represent the only viable alternative optical elements for the creation of high speed, reliable, reasonably priced photolithography systems for use at DUV and EUV wavelengths. Currently, there is no manufacturable process for coating the figured DUV and EUV mirrors necessary for advanced photolithography systems. As such, the present invention discloses a system and method of coating, for example, flat or figured optical substrates, with a high-reflectivity multi-layer coating that will permit the development and implementation of projection EUV photolithography production in the mass commercial micro-electronic marketplace. The present invention presents for the first time a manufacturable-controlled and repeatable—deposition technique for fabricating DUV and EUV mirrors. The ability to precisely coat high-reflectance, flat or figured DUV and EUV optics offers a substantial reduction in the minimum attainable feature size through the use of shorter wavelength radiation, which results in substantial miniaturization of ICs, sensors, and other micro-electronic components.

SUMMARY OF THE INVENTION

The present invention is a method for fabricating high-precision thin film mirrors for use at DUV and EUV wavelengths, the method generally comprising the steps of characterizing at least one optical substrate; selecting a first target material and a second target material to be deposited on the at least one optical substrate, the first and second targets materials having suitable refractive indices N at a desired wavelength of operation. For relatively long wavelengths ($\lambda$>150-nm), the real part, n, of the refractive index (N=n+ik) is modulated. The first target material has as low an n value as possible, while the second target material has as high an n value as possible. Both first and second target materials have low absorption constants (k). For shorter wavelengths ($\lambda$<150-nm) the imaginary part, k (absorption constant), is modulated. The first target material has as low a k value as possible, while the second target material has as high a k value as possible. The method further includes the steps of calibrating the thickness deposition profiles for the first material and the second material; modeling a desired thickness deposition profile for the first material and the second material; alternately depositing a predetermined number of layers of appropriate thicknesses of the first material and the second material on the optical substrate to produce distinct, well-defined layers for the multi-layered mirror, the layers of appropriate thicknesses of the first material and the second material being deposited at a predetermined power, deposition rate, and deposition pressure; and characterizing the multi-layered mirror.

The present invention is also a photolithography system employing the high precision multi-layered mirrors (fabricated by the method of the present invention) for use with either a DUV or an EUV radiation source, a wafer, and a mask to be imaged on the wafer. The photolithography system includes condenser means for collecting radiation from the radiation source, for processing the radiation, and for illuminating the mask, the condenser means including optics using multi-layered mirrors; and camera means for receiving the radiation collected from said the means, for imaging to the mask and for delivering radiation to the wafer, the camera means including optics using multi-layered mirrors. A photolithography system designed for use at 193-nm is capable of up to 99% radiation throughput from each mirror and can resolve image feature sizes down to 0.18-$\mu$m. A photolithography system designed for use at 13.4-nm is capable of up to 68% radiation throughput from each mirror and can resolve image feature sizes down to 0.10-$\mu$m. Finally, a photolithography system designed for use at 248-nm is capable of up to 99% radiation throughput from each mirror and can resolve image feature sizes down to 0.25-$\mu$m.

The present invention offers the ability to predict and achieve a wide range of thickness profiles on flat or figured substrates, i.e., account for $1/R^2$ factor in a model, and the ability to predict and accommodate necessary changes in sputter deposition rate as a result of plasma geometry, i.e., over figured substrates.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWINGS

The accompanying figures, which are incorporated in and form part of the specification, further illustrate the present invention and, together with the detailed description of the invention, serve to explain the principles of the present invention.

FIGS. 1a and 1b are prior art diagrams of the present technology for coating figured EUV optics. FIG. 1a is a top view while FIG. 1b is a side view.

FIG. 2 is a representation of a photolithography system employing a plurality of mirrors that are coated using the method of the present invention.

FIG. 4a is a centered (no lateral scanning) deposition which shows the classic Gaussian thickness distribution; FIG. 4b is a uniform deposition profile that can be obtained by moving the substrate laterally to four different positions (center C, offset position P1, offset position P2, and offset position P3) and parking it at each position for a predetermined length of time; and FIG. 4c shows a concave thickness profile that can be obtained by moving the substrate laterally to the same four parking positions as used in FIG. 4b, but for different lengths of time.

FIG. 6 is a flowchart of the method steps of the present invention.

DETAILED DESCRIPTION OF THE INVENTION

Figure 3:
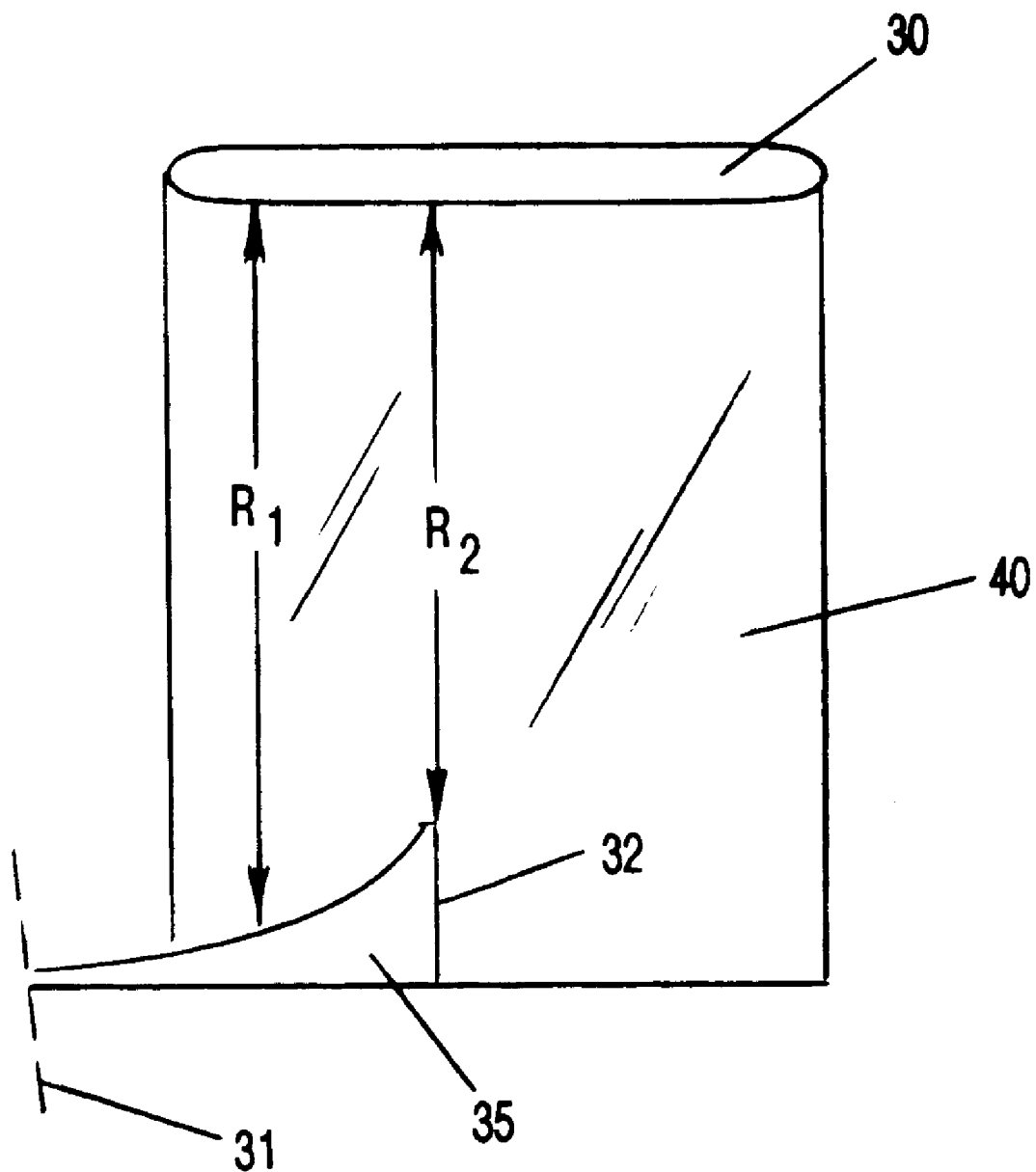
FIG. 3 is a cutaway side view of the target and figured optical substrate in accordance with the present invention.

The present invention is expected to find use in a wide variety of cases where EUV wavelengths are of interest. As will become evident from the following detailed description of the invention, the present invention is useful in many EUV applications but, for purposes of illustration and convenience in introducing the present invention, the use of the present invention in photolithography systems will be used as an example. The present invention will enable the use of EUV radiation in a conventional photolithography stepper system.

The term "lens" is used in the conventional manner herein to define any optical element that causes X-ray radiation to converge or diverge. Lenses in X-ray systems are generally reflecting and are sometimes referred to as "mirrors." The convergence or divergence is a result of action analogous to that of a transmission optical lens. A figured (also referred to herein as curved, spherical, or powered) mirror is either a concave or a convex mirror whose surface forms a continuous, radially-symmetric surface. Although the present invention depicts the use of spherical mirrors, it is intended that other figured mirrors be covered by the present invention, such as parabolic, hyperbolic, etc., and mirrors that may be substituted for spherical mirrors within tolerable industry standards, including those with minor flaws or aberrations, etc. A flat mirror is a mirror whose surface is nearly flat within manufacturing tolerances. Although the present invention depicts the, use of flat or figured mirrors, it is intended that the present invention be easily modified by those of skill in the art to employ the use of spherical mirrors where flat mirrors are disclosed, and vice6 versa, in the following discussion.

Reflective multi-layer coatings can be fabricated for DUV wavelengths of interest by alternately depositing materials of high and low refractive indices N into distinct, well-defined layers. The real component n of the refractive index N (N=n+ik) is modulated in multi-layered coatings designed for use at 193-nm and 248-nm. This stack of thin film coatings is analogous to the high-reflectivity quarterwave stacks designed for use at visible wavelengths (about 500-nm). For EUV wavelengths, the imaginary component k (absorption constant), rather than the real component n of the complex refractive index N, is modulated (N=n+ik). Presently, flat mirrors for operation at 13-nm are fabricated by alternately depositing thin films of low and high absorption materials, e.g., Si (Silicon) and Mo (Molybdenum), respectively. Extremely precise thickness control is required over the entire optic as the total bi-layer period is only about 7-nm. In addition, the multi-layered coatings must have extremely small interfacial roughness (e.g., $\leq 1.5$ Å rms roughness for 13-nm wavelength of operation) in order to minimize scattering losses and maximize reflectivity. Figured (or curved) optics that are required for focusing applications are even more difficult to coat precisely because the coating thickness must increase toward the edges of the optics to maintain a high reflectivity across the entire mirror surface.

As discussed earlier, multi-layered, high-reflectance coatings (mirrors) represent the only viable alternative optical elements for the creation of high-speed, reliable, reasonably-priced photolithography systems for use at DUV and EUV wavelengths. Reflective multi-layered coatings can be fabricated in accordance with the present invention for a wavelength of interest by alternately depositing materials of high and low refractive indices N, where N=n+ik. For relatively long wavelengths ($\lambda \geq 150$-nm), the real component n of the refractive index N is modulated. The thin film material pairs are selected by finding at least two thin film materials that have refractive indices N with very low k (absorption constant) values and a large contrast in n values at the desired wavelength of operation. The large contrast in n values between the two thin film materials serves to maximize reflectance from the multi-layered stack. In addition, the thin film materials are to be selected based upon their low chemical interaction, good availability, ease of deposition, and non-toxicity.

Use of very short wavelengths of light increases resolution but decreases the depth of focus ("DOF") in an optical system according to the following equations:

$$\text{resolution} = \frac{c_1 \lambda}{NA} \quad \text{Eq. (1)}$$

and $$DOF = \frac{c_2 \lambda}{(NA)^2}, \quad \text{Eq. (2)}$$

where $\lambda$ is the wavelength of light, NA is the numerical aperture, and $c_1$ and $c_2$ are constants that are dependent upon the image formation process. Because DOF decreases with the wavelength, it becomes progressively more difficult to maintain an adequate and affordable process latitude (DOF/exposure window) at shorter wavelengths. It is possible, however, to maximize the DOF in an optical system by proper design. A DOF of greater than or equal to 0.5-$\mu$m usually is sufficient to ensure that the image is in focus over the entire field. The theoretical maximum reflectance that can be obtained using properly designed Si/Mo multi-layered mirrors for use at 13.4-nm is about 68%. The theoretical maximum throughput of the optical system 400 using these mirrors 420, 450, and 460 at 13.4-nm is $(0.68)^x$, where X is the number of mirrors in optical system 400.

Referring to FIG. 2, in one embodiment of optical system 400 employing a plurality of mirrors 420, 450 and 460 coated in accordance with the method of the present invention, it was possible to print 0.1-$\mu$m feature sizes over a 1-$\mu$m DOF, with a diffraction limited image field of 25-$\mu$m×50-$\mu$m. Condenser 410 is an optical system with surface mirror 420 for collecting the radiation 408 from radiation source 405, for processing the radiation 408 and for illuminating the mask 430. Radiation source 405 can be an EUV source such as a laser plasma or a synchrotron radiation source, or can be a DUV source such as an ArF or KrF laser. Condenser 410 includes optics that are responsible for collecting the radiation 408 and for processing the collected radiation 412 for delivery to mask 430. Mask 430 can be transmissive or reflective depending upon the design of the optical system 400. Following condenser 410, are imaging or camera optics, in addition to the collecting and processing optics, responsible for delivering radiation to resist-coated wafer 470. The camera optics include primary mirror 460 and secondary mirror 450, which are coated using the method of the present invention. The camera optics include a camera pupil having a real or virtual aperture 440 that defines the position through which the radiation must enter the camera, of angular size defining the diffraction limit of the camera. Additionally, the camera optics include an aperture stop which defines the point at which the principal rays cross; the stop serves to fold the ray bundles, i.e., to move the image to the other side of the optics. The performance of the optical system 400 was limited by a non-ideal illuminator (or condenser) and low radiation throughput. The performance of the condenser 410 is improved, however, by using an ellipsoidal mirror rather than a spherical mirror. The radiation throughput is improved using the coating method of the present invention to fabricate multi-layered, high-reflectance, figured EUV mirrors 420, 450, and 460 for use in the optical system 400.

The photolithography system employs the high precision multi-layered mirrors (fabricated by the method of the present invention) for use with either a DUV or an EUV radiation source, a wafer, and a mask to be imaged on the wafer. The photolithography system includes condenser means for collecting radiation from the radiation source, for processing the radiation, and for illuminating the mask, the condenser means including optics using multi-layered mirrors; and camera means for receiving the radiation collected from said the means, for imaging to the mask and for delivering radiation to the wafer, the camera means including optics using multi-layered mirrors. A photolithography system designed for use at 193-nm is capable of up to 99% radiation throughput from each mirror and can resolve image feature sizes down to 0.18-$\mu$m. A photolithography system designed for use at 13.4-nm is capable of up to 68% radiation throughput from each mirror and can resolve image feature sizes down to 0.10-$\mu$m. Finally, a photolithography system designed for use at 248-nm nm is capable of up to 99% radiation throughput from each mirror and can resolve image feature sizes down to 0.25-$\mu$m.

At shorter wavelengths ($\lambda \leq 150$-nm), the imaginary component k (absorption constant) of the refractive index N is modulated to produce a high-reflectance multi-layered coating. To date, a great deal of theory has been developed for high-reflectance multi-layered structures for use at these short wavelengths. Rosenbluth has calculated the theoretical reflectance for numerous materials pairs in the spectral region $0.6 < \lambda < 12.4$ nm. (See A. E. Rosenbluth, Ph.D. Dissertation, University of Rochester (1983); A. E. Rosenbluth, Revue Phys. Appl. 23, 1599 (1988)). Rosenbluth's calculations are based upon a method presented by A. V. Vinogradov and B. Y. Zeldovich, which assumes perfectly sharp interfaces within the multi-layer. (See A. V. Vinogradov and B. Y. Zeldovich, Appl. Opt. 23, 89 (1977).) More accurate theoretical treatments of scattering of EUV radiation from rough interfaces in multi-layered structures have been presented by various authors. (See, e.g., W. Ehrlenberg, J. Opt. Soc. Am. 39, 746 (1949); L. Nevot and P. Croce, Rev. Phys. Appl. 15, 761 (1980); and B. Vidal and P. Vincent, Appi. Opt. 23, 1794 (1984).) One computational method that accounts for the reduction in reflectance caused by scattering accounts for losses caused by inter-diffusion of the two different thin film materials at the interfaces. (See E. Spiller and A. E. Rosenbluth, Opt. Eng. 25, 954 (1986).) In addition, a general theory used to predict the scattering of EUV radiation from non-ideal surfaces within multi-layered structures has been presented by Stearns. (See D. G. Stearns, J. Appi. Phys. 65, 491 (1989); D. G. Stearns, J. Appl. Phys. 71, 4286 (1992).)

Figure 4A:
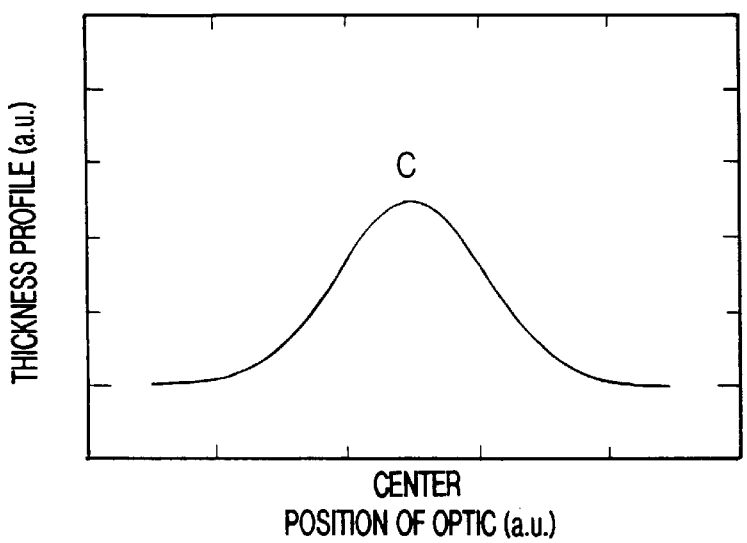
FIGS. 4a–c are two-dimensional diagrams of thickness profiles obtained by a variety of scanning routines.
Figure 4B:
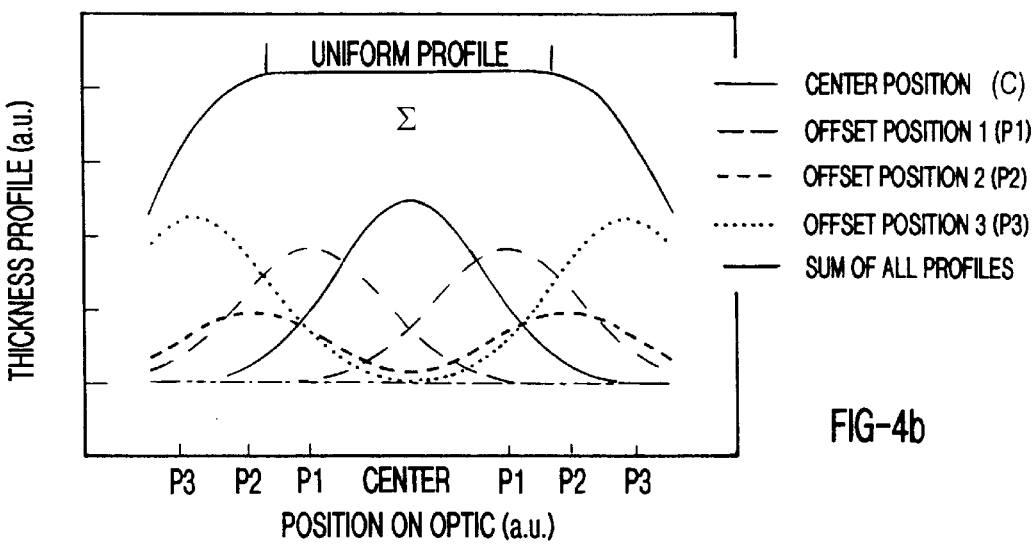
Figure 4C:
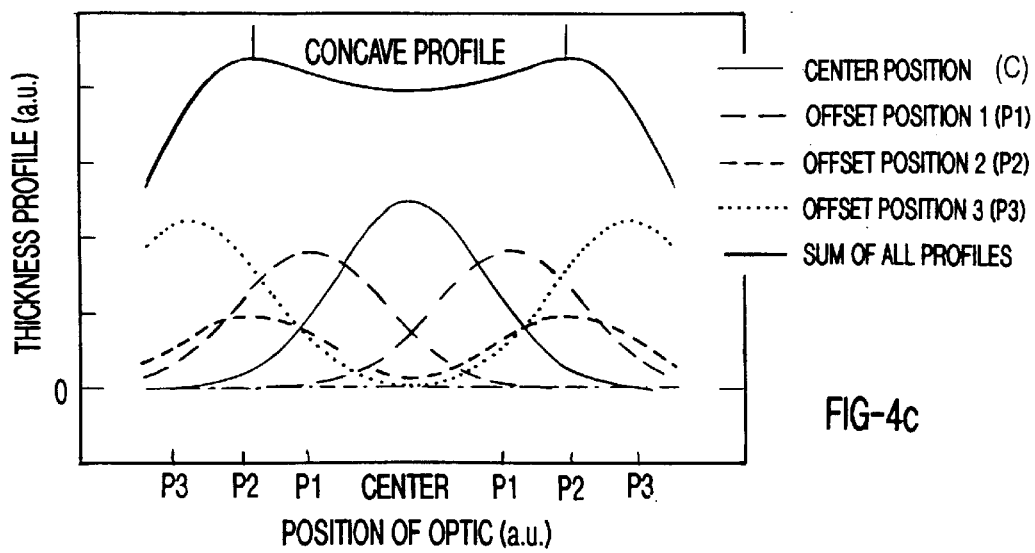

The present invention uses a direct line-of-sight deposition process to design and fabricate multi-layer coatings with a wide range of radially-symmetric thickness profiles, which includes non-uniform deposition rates such as those necessary for depositing uniform films on non-planar surfaces or variable thickness films on figured optics. The present invention offers the ability to predict and achieve a wide range of thickness profiles on flat or figured substrates, i.e., compensate or account for $1/R^2$ factor in a model, and the ability to predict and accommodate changes in sputter deposition rate as a result of plasma geometry, i.e., over figured substrates, where R is the normal distance from the target 30 to the figured optic 35 at any given point (see FIG. 3). The volume of the plasma 40 is roughly cylindrical. As illustrated in FIG. 3, R varies for figured optics depending upon the reference point; R decreases moving toward the edge 32 of the figured optic 35, but increases toward the center 31 of the figured optic 35. Conversely, the value for R remains the same at any given point of a flat optic (not shown). In the present invention; the relative deposition rate across a flat or figured optical substrate is controlled by moving the optical substrate with respect to the deposition source (sputtering target) as shown in FIGS. 4a–c, which contain two-dimensional diagrams of thickness profiles obtained by a variety of scanning routines. This is in contrast to the current technology in which the relative deposition rate is controlled by preferentially blocking part of a uniform deposition flux before it reaches the optical substrate (as described above with reference to FIGS. 1a and 1b) or by adjusting the relative velocity of the substrate as it is rotated and scanned with respect to the sputter target (as described above with reference to Vernon et al.). Vernon et al. employ a continuous circular motion for the deposition in which the substrate rotates around the entire deposition chamber. Consequently, the Vernon et al. method is a single pass deposition for each layer. In contradistinction, the present invention employs a non-continuous method in which the substrate is brought to a stop in preset positions for preset durations of time (according to a modeling program) while the deposition occurs. The present invention is a multiple pass deposition; each layer within the multi-layer requires multiple passes under the same target. The present invention allows for the precise thickness control and repeatability necessary to coat figured optics with a prescribed thickness gradient for short wavelength focusing applications. FIG. 4a shows a centered (no lateral scanning) C deposition profile, which shows the classic Gaussian thickness distribution. FIG. 4b shows a uniform deposition profile $\Sigma$ that can be obtained by moving the substrate laterally to four different positions, center C, offset position P1, offset position P2, and offset position P3, and parking it at each position for a predetermined length of time. FIG. 4c shows a concave thickness profile that can be obtained by moving the substrate laterally to the same four parking positions as used in FIG. 4b (C, P, P2, and P3), but for different, predetermined lengths of time than those used in FIG. 4b.

The method of the present invention deposits multi-layer optical interference coatings (mirrors) on flat or figured (curved) optical substrates with the appropriate thickness gradient for use at short wavelengths, specifically 193-nm and 13-nm, for the first time. The method of the present invention can be performed in part using an extensive computer-driven thin film modeling and deposition program. Such a program is commercially-available for use in the present invention, with some required modifications to account for $1/R^2$ and plasma geometry, in a sputter deposition system, model PVD-300 Multi-Source Sputtering System, manufactured and patented (U. S. Pat. No. 4,858, 556) by UniFilm Technology. The modeling and deposition program enables very precise vertical and lateral thickness control on flat or figured optical substrates by scanning the position of the optical substrate with respect to the sputter target during deposition. The modeling and deposition program enables an accurate model of the thickness profile as a function of scanning parameters before deposition, which enables the implementation of an appropriate scanning algorithm. Thus, it is possible to design and fabricate coatings with a wide range of radially-symmetric thickness profiles. This includes a prescribed thickness non-uniformity such as uniform films on non-planar surfaces or variable thickness films on figured optical substrates. This is critical for achieving the precise thickness control and repeatability necessary to coat figured optical substrates with a prescribed thickness gradient for short wavelength focusing applications.

In one aspect of the present invention, a computer program, based upon Rosenbluth's calculations, is used to determine the theoretical reflectance for multi-layers using different thin film material pairs. A computer program suitable for use in this aspect of the present invention is described in P. A. Kearney, J. M. Slaughter, and C. M. Falco, SPIE Proc. 1343, 25 (1991) and thus, will not be discussed in detail herein. In addition, an iterative coating design computer program is used to determine the optimum thickness of each thin film material based upon the optical constants of the materials, the wavelength of operation, the number of periods, and the angle of incidence. An iterative coating design computer program suitable for use in this aspect of the present invention is found in A. R. Lampis, *Best Program*, Laboratory for X-Ray Optics, The University of Arizona (1988) and thus, will not be discussed in detail herein. The ability to determine the optimum layer thickness based upon the angle of incidence is especially critical for coating figured optics because the angle of incidence changes as a function of position on the optic. A suitable coating design computer program enables the determination of the appropriate thicknesses and thickness gradient required to achieve high reflectance from all parts of a figured optic.

In one embodiment of the present invention, a deposition technology is used to calibrate the deposition profile and then a computer algorithm is implemented to sputter deposit a radially-symmetric, line-of-sight, multi-layer coating on an optical substrate for use at DUV or EUV wavelengths. The PVD-300 computer-driven thin film deposition program, manufactured by UniFilm Technology, is suitable for use in the present invention to deposit highly-uniform thin films over large surface areas using a small sputtering source. The thin film deposition program provides precise thickness control over flat substrates by scanning the position of the substrate with respect to the sputter target during deposition. The comprehensive modeling program available from UniFilm Technology enables accurate modeling of the thickness profile as a function of scanning parameters before deposition and then implements the appropriate scanning algorithm to achieve the desired thickness profile. Using the method of the present invention, it is possible to design and fabricate coatings with a wide range of radially-symmetric thickness profiles, which include a prescribed thickness non-uniformity such as uniform films on non-planar surfaces or variable thickness films on figured optical substrates.

Figure 5:
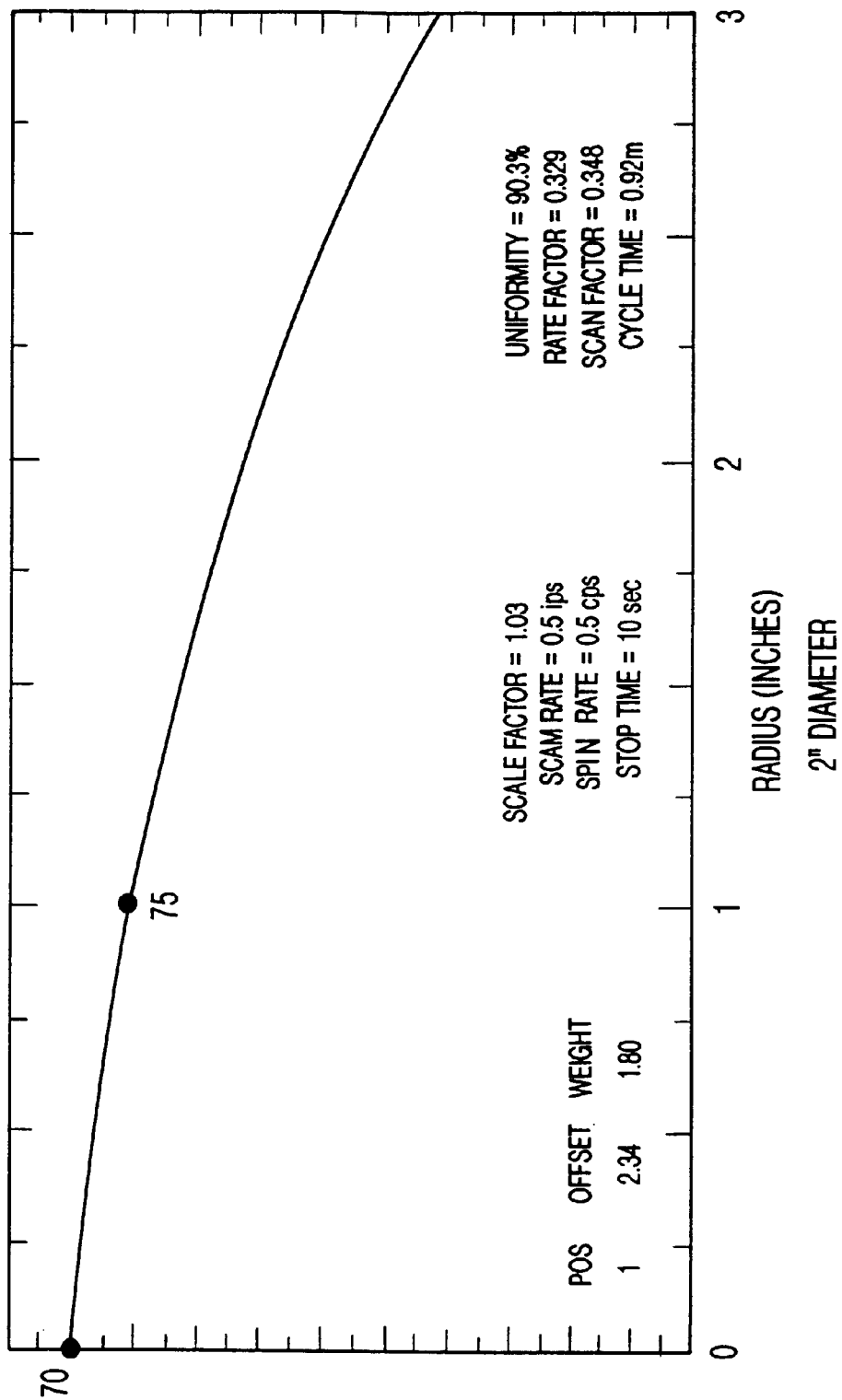
FIG. 5 is a deposition profile for a figured optic with radius of curvature equal to 100-mm.
Figure 8:
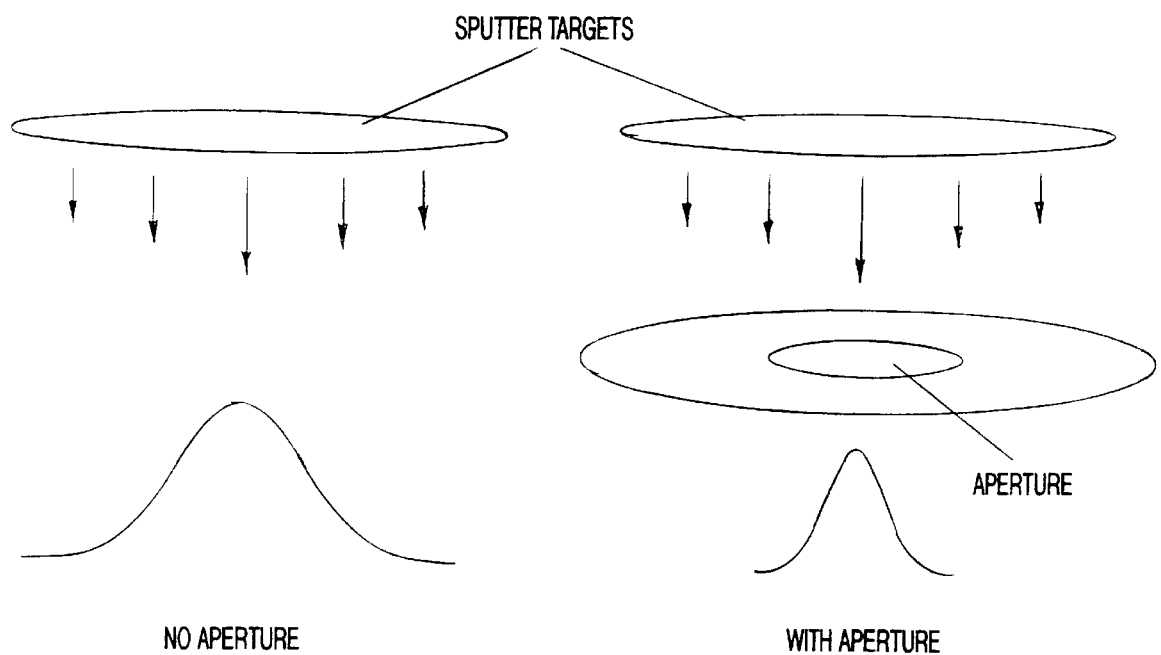
FIG. 8 is an alternate embodiment in accordance with the present invention.

The PVD-300 Unifilm Technology system, however, requires a modification to account for coating figured optics that have a variable source-to-substrate separation distance R. In particular, it will be necessary to predict and achieve a wide range of thickness profiles on figured optical substrates. This will require the PVD-300 Unifilm Technology modeling program to account for a $1/R^2$ dependence of deposition rate on source-to-substrate separation distance, R; R varies with position for deposition over figured optical substrates because of the radius of curvature. As an example, the edge of a 50-mm diameter concave spherical mirror with a radius of curvature of 100-mm is 3.18-mm closer to the sputter target than is the center of the mirror. For a source (sputter target) to substrate (center of mirror) distance of 64-mm, the difference in distance alone results in relative deposition rate that is 9.7% lower at the center than at the edge of the figured mirror. In order to achieve a uniform thin film over the entire surface of the mirror, the deposition (thickness) profile must be graded across the surface until it has been reduced by 9.7% at the edge. Referring to FIG. 5 for example, there is shown the programmed deposition profile for a figured optic with a radius of curvature of 100-mm. There is a 9.7% thickness gradient from the center 70 of the wafer to the edge 75 of the wafer which needs to be taken into account for a uniform deposition of the figured optic. In addition, the PVD-300 Unifilm Technology modeling program needs to account for localized changes in the deposition rate as a result of changes in the plasma geometry, i.e., deposition over figured optical substrates. In addition, some hardware modifications to Siebert's system are contemplated, such as an increase in substrate spin rate and installation of a small round aperture at the source (as shown in FIG. 8) to obtain greater lateral thickness control. In practice, the changes in R are accounted for by changing (manually inputting) the preset "parking" positions and times so that the computer program believes the thickness profile of the layer has changed.

Using the method of the present invention, reflective multi-layer coatings can be fabricated for wavelengths of interest by alternately depositing materials of suitable high and low refractive indices N into distinct, well-defined layers. In general, for relatively long wavelengths ($\lambda$>150-nm), the real component n of the refractive index N (N=n+ik) is modulated. The first target material has as low a n value as possible, while the second target material has as high a n value as possible. Both materials have as low absorption (k) constants as possible. For shorter wavelengths ($\lambda$<150-nm), the imaginary component k (absorption constant) of the refractive index N is modulated. The first target material has as low a k value as possible, while the second target material has as high a k value as possible.

The present invention proposes, for example, the material pairs listed in Table I for the high and low refractive index thin film materials for the specified wavelength. The material pairs listed in Table I were selected by identifying thin film material pairs that have refractive indices N with very low k (absorption constant) values and a large contrast in n values at the selected wavelengths. The large contrast in n values between the two thin film materials serves to maximize reflectance from the multi-layer stack. In addition, the thin film materials listed in Table I were selected based upon their low chemical interaction, good availability, ease of deposition, and non-toxicity.

TABLE I

High and low refractive index material pairs for use in DUV and EUV multi-layer mirrors for the specified wavelengths of operation.

| Wavelength (nm) | High index | Low index |
| --- | --- | --- |
| 193 | $Al_2O_3$ | $SiO_2$ |
| 193 | $Al_2O_3$ | $MgF_2$ |
| 193 | $Al_2O_3$ | $CaF_2$ |
| 13 | Mo | Si |

At 193-nm, the real component n of the refractive index N (N=n+ik) is modulated. The 193-nm wavelength is of interest because it can be readily from high-efficiency, commercially-available ArF laser light sources. At 13.4-nm, the imaginary component k (absorption constant) of the refractive index N is modulated. The 13.4-nm wavelength is of interest because it is the wavelength at which a particular material pair, e.g., Mo and Si, produces one of the highest theoretical reflectance values (approximately 68%) possible at very short wavelengths. The thin film material pairs listed in Table I can be used for the specified wavelengths of operation.

Additionally, other combinations of materials can be selected using Be, B, $B_4C$, or C as the low absorption material at even shorter wavelengths. These materials can be incorporated into high-reflectivity multi-layers for $\lambda$ less than 13-nm because they have an absorption edge below that wavelength. This reduction in operating wavelength will produce higher resolution in photolithographic processes, enabling additional reductions in the attainable minimum feature size.

A. Characterization of Starting Materials Prior to Deposition

The uncoated optical substrates, the thin film sputter targets, and the process gases in the deposition chamber are assayed or characterized by the vendor (a material analysis specification is provided by vendor according to the operator's specifications) prior to their use in the present invention. Characterization of the uncoated optical substrate generally means ascertaining or determining the properties or components thereof, including the type of geometric figure (e.g., spherical or parabolic), focal length (curvature), wavefront error, root-mean square surface roughness, etc. Characterization of the thin film materials and process gases generally means ascertaining or determining that the thin film materials and process gases are chemically pure materials; the operator of the deposition chamber needs to know of the presence of any undesired materials, which is especially true of silicon targets. Prior to deposition of the thin film materials, the operator of the deposition chamber needs to ensure that the sputter targets and the uncoated optical substrate have been polished correctly and have the required geometric figure and surface finish. The thin film materials need to have sufficiently high purity (>99.99% pure) to result in maximum reflectance of the multi-layered mirrors produced. After the thin films have been deposited, the multi-layered mirrors should be characterized. Characterization of the multi-layered mirrors produced generally means using x-ray reflectometry as a preliminary analysis technique to determine the (1) the bi-layer period, (2) the thickness of each material layer, (3) the average interfacial roughness, and (4) any variations in layer thicknesses. This information then can be used to adjust the deposition parameters in order to obtain an optimized multi-layered structure for use as either a DUV or EUV mirror. The characterization step of the multi-layered mirror produced is to measure the actual reflectance from a multi-layered mirror using the desired wavelength of operation. For DUV mirrors, this can be accomplished using either a KrF (248-nm) or an ArF (193-nm) laser source. EUV mirrors can be tested using, for example, either a synchrotron or a plasma source at the desired wavelength.

Uncoated optical substrates, thin film sputter targets, and process gases must be characterized prior to deposition. The overall shape and deviations from the ideal shape of the (figured or flat) uncoated optical substrates are characterized using interferometric techniques, which are performed by the vendor (at a wavelength comparable to the desired wavelength of operation). Typically, an interferometric technique that uses a comparably short wavelength of light (DUV or EUV) is appropriate. Because the resolution of interferometric techniques is proportional to the wavelength of incident radiation, only DUV or EUV radiation are useful.

The compositions of the thin film sputtering targets can be characterized by using electron microprobe analysis or Rutherford backscattering spectrometry. Target compositions should be greater than 99.99% pure. In addition, all process gases used during the sputter deposition process should also be greater than 99.99% pure as specified by gas chromatagraph mass spectroscopy. Impurities within the targets or gases will alter the compositions of the resultant thin films, change the optical constants (i.e., refractive index N), and reduce the overall reflectance from a multi-layered mirror structure.

B. Steps for Fabricating Mirrors Once Thin Film Material Pair Selected

The method of the present invention will now be discussed in more detail with the aid of FIG. 6.

Step 100. Determine optimum deposition parameters for both thin film materials and calibrate their deposition profiles and deposition rates.

Step 110. Perform an adequate pre-sputter of both deposition targets. For example, pre-sputter for about 1–2 hours at maximum current (e.g., 0.45 amps) prior to calibrations or depositions in order to remove any impurities from the surface. This is especially important in the case of a Si target because of its affinity for oxygen. The formation of a $SiO_2$ layer on the surface of a Si target will dramatically affect the deposition rate until the oxide layer has been sputtered off. In addition, the oxygen released from the $SiO_2$ layer is likely to be incorporated into the thin film as a contaminant. This contamination can alter the effective thickness and refractive index of the Si layers. For these reasons, an adequate pre-sputter of both deposition targets should be performed prior to deposition to remove any contaminants.

Step 120. Determine the optimum deposition pressure, which is specific to the deposition chamber used and will vary accordingly, for both thin film materials to enable "co-deposition" (i.e., both targets are sputtered simultaneously at the same chamber pressure). The deposition pressure should be adjusted such that: (1) reasonable peak deposition rates (e.g., on the order of 100 Å/minute) can be achieved; (2) adatom energies are sufficient to enable surface mobility at the substrate, but not so great as to cause surface damage (e.g., roughening of the interface); and (3) a stable plasma can be obtained for both thin film materials being sputtered simultaneously as evidenced by constant power, no flickering, and repeatable deposition rates. Using a low deposition pressure, e.g., 6.35 mTorr, has proven to produce high-quality Mo/Si multi-layer mirrors. On the other hand, there is a certain minimum pressure of about 5 mTorr that is required to generate stable plasmas at both the Si and the Mo sources simultaneously in the deposition chamber used.

Step 130. If possible, use DC power for both thin film materials to maximize plasma stability. DC sputtering is a more stable deposition process than RF sputtering for conductive targets and, consequently, results in more stable deposition rates. This results in thickness profiles with the highest possible precision and accuracy. In the case of insulating thin film source materials, however, standard DC sputtering is not practical because charge build-up and the resultant thermal stress can cause the target to break. It is contemplated that it is possible to use pulsed-DC sputter deposition technique in order to obtain stable deposition rates from insulating target materials.

Step 140. Determine the optimum deposition rate. A low deposition rate is required, e.g., a rate less than or equal to 100 Å/min, in order to achieve sufficient thickness uniformity during the short deposition process. In other words, the optical substrate must have enough time to be rotated and scanned in accordance with the deposition program in order to attain the desired overall deposition profile. On the other hand, the deposition rate should be as high as possible to minimize impurity or contaminant incorporation during the deposition process, which may affect the index of refraction, because the thin films are reactive with atmospheric components (e.g., oxygen and nitrogen).

Step 150. Calibrate the thickness deposition profiles for all thin film materials using, for example, the computer-driven UniFilm calibration program.

Step 160. Sputter deposit thin films of both thin film materials and measure actual thickness and uniformity using, for example, a conventional stylus profilometer or scanning electron microscope in a manner well known to those of skill in the art. Compare actual thickness to "specified" thickness and determine and implement a scale factor for subsequent depositions.

Step 200, model the desired thickness deposition profiles for both thin film materials using, for example, the UniFilm modeling program.

Step 210. Provide "parking" positions and times to the co-deposition program to produce highly-uniform coatings. The UniFilm modeling program automatically inputs "parking" positions and times to produce highly-uniform flat coatings; however, the parking positions and times must be input manually (decided upon by operator) for figured optics unless the UniFilm program is modified as discussed earlier;

Step 220. When making figured optics, the UniFilm modeling program needs to account for required thickness gradient of thin films and figured (non-flat) "substrates." Accordingly, Steps 222 and 224 are employed.

Figure 7:
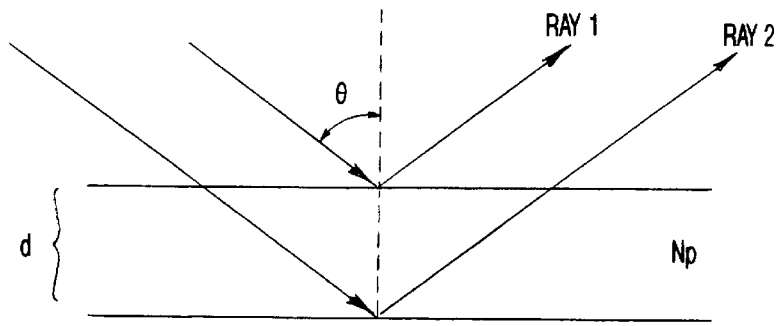
FIG. 7 is an illustration of a layer of the multi-layer coating to aid in calculating the optical phase shift.

Step 222. The thickness gradient of thin films can be determined by a commercially-available thin film coating design program that optimizes reflectance by maintaining a constant phase shift between rays (Ray 1 and Ray 2) reflected from the top and bottom surfaces of a thin film layer P. The phase shift, δ, is given by $\delta = (4\pi d N_p \cos\theta)/(\lambda) \pm \pi$ it where d is the thickness of layer P, N is the refractive index of layer P (thin film layers), θ is the angle of incidence of incoming light (as measured with respect to the normal) and λ is the wavelength of light source. FIG. 7 illustrates reflections from the top (Ray 1) and bottom surfaces (Ray 2) of a flat thin film and the quantities of interest. The reflectance from the thin film layer P is maximized when $\delta = 2m\pi$ where m is any integer. For a figured (curved) optic, the angle θ changes across the optic which requires a corresponding change in thickness d in order to maintain a constant phase shift, δ. The required thickness gradient is dependent upon: (1) curvature of the figured optic (angle of incident radiation for all points on the figured optic); (2) refractive index N of the thin film materials; and (3) the angle of incidence of incoming radiation.

Step 224. As discussed earlier, if the UniFilm Technology program is used for coating figured substrates in accordance with the present invention, the program will require an adjustment to account for: (1) $1/R^2$ dependence of deposition rate, where R is the normal distance from the target to the substrate at any given point; and (2) dependence of deposition rate on plasma geometry at different points along the figured optical substrate. Objects placed under the source can significantly alter the source distribution. The plasma geometry of the source changes when figured optics are processed.

Step 300. Deposit multi-layered thin film stack using the UniFilm Technology co-deposition program according to calibration and modeling programs. The deposition begins with a first material having a low index of refraction, e.g., Si, and is followed with a second material having a high index of refraction, e.g., Mo.

Step 400. Characterize Multi-layered Mirrors.

Step 410. Use X-ray reflectometry at, for example, 1.54 Å and model results (using, for example, Kearney et al. program, Laboratory for X-Ray Optics, University of Arizona (1988)) to characterize or determine: (1) the bi-layer layer period, (2) the thickness of each material layer, and (3) the average interfacial roughness. Modeling the results also enables detection of a decoupled signal that is caused by variations in layer thicknesses.

Step 420. Characterize a number of different points on the figured optical substrate to assess thickness gradient accuracy. The number of required data points is dependent upon the curvature of the optic and the prescribed thickness gradient and will become apparent to those of skill in the art.

Step 430. Use results from Steps 410 and 420 to optimize deposition times and thickness profiles used to deposit the multi-layered stack in Step 300; and Step 440. Characterize ultimate reflectance of optimized multi-layered mirror using an appropriate radiation source (e.g., synchrotron radiation for 13.4-nm, or ArF laser radiation for 193-nm).

Referring to FIG. 8, in an alternate embodiment, the present invention employs a stationary circular aperture located in-between the source and the mirror substrate to restrict the lateral extent of the deposition profile, which provides even greater precision over lateral thickness control by narrowing the width of the Gaussian-shaped deposition profile. The greater control achieved enables fabrication of coatings for very fast (short focal length) EUV mirrors. The alternate embodiment presented herein includes all of the deposition technology elements and features listed in the embodiment discussed above and, thus, will not be discussed again.

Figure 9A:
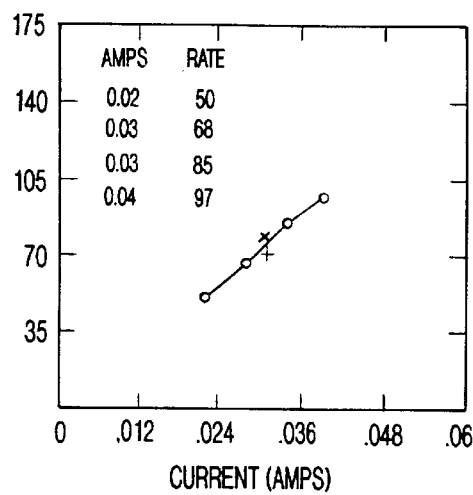
FIGS. 9a–9c are profile calibrations for use with the example presented herein.
Figure 9B:
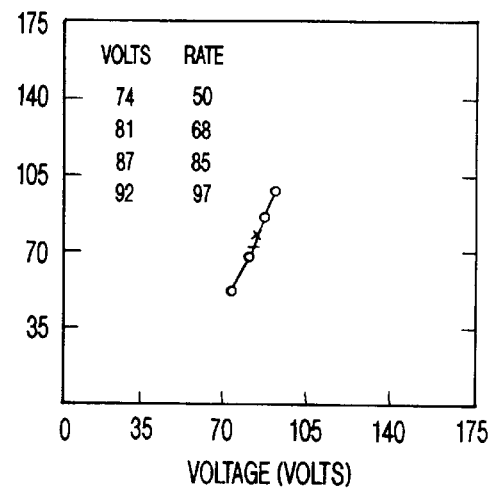
Figure 9C:
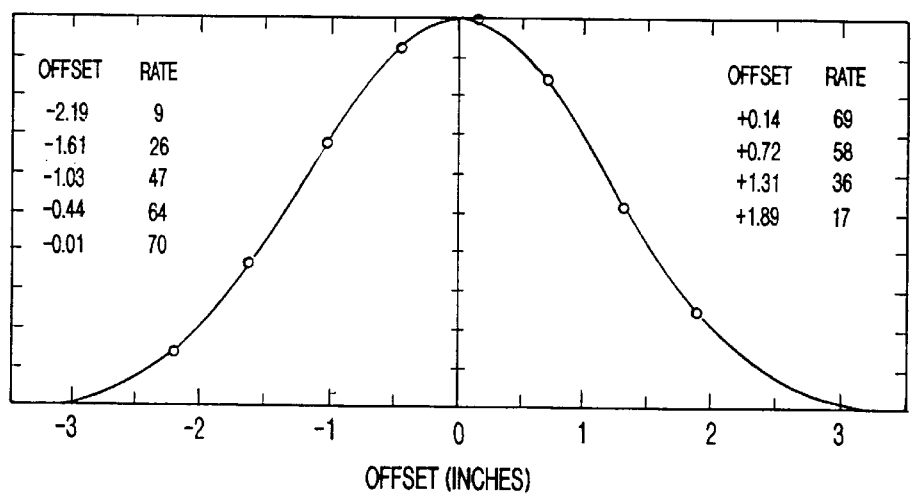

The particular values and configurations discussed in the following non-limiting example can be varied and are cited merely to illustrate an embodiment of the present invention and are not intended to limit the scope of the invention. In the following non-limiting example, several flat mirrors (EUV7, EUV8, and EUV9) designed for use at 13.4-nm were fabricated at Sandia National Laboratories in Albuquerque, N.M. using the method of the present invention. Approximately 2.5-nm Mo and 4.4-nm Si thin film layers were alternately deposited to fabricate several flat multi-layer mirrors using the method of the present invention. The thin film deposition parameters that were determined and used are listed in Table II. The base chamber pressure used for these experiments before deposition was determined to be less than or equal to $3 \times 10^{-7}$ torr. The chamber pressure used for these experiments during deposition was determined to be $6.35 \times 10^{-3}$ torr for a stable plasma, which was specific to the deposition chamber used. The Ar pressure was $3.3 \times 10^{-3}$ torr (100 sccm). FIG. 9a, shows the calibrated deposition rate (in Å/min) for Mo as a function of current (in amps). FIG. 9b shows the calibrated deposition rate (in Å/min) for Mo as a function of voltage (in volts). FIG. 9c shows the calibrated deposition (thickness) profile for Mo as a function of the lateral offset (in inches). Deposition rate is a function of the substrate position with respect to the source.

Figure 10:
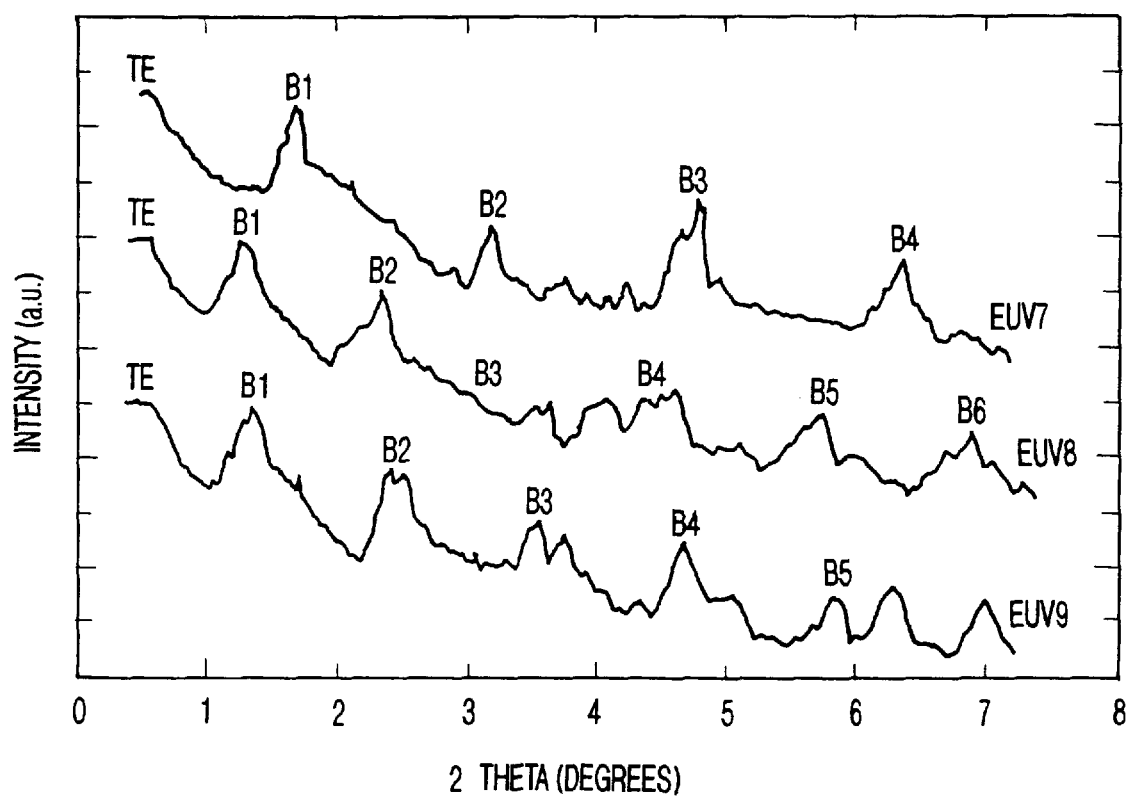
FIG. 10 is a graph of X-ray reflectometry data for three exemplary multi-layer Mo/Si flat mirrors deposited in accordance with the present invention.

Multi-layer structures were fabricated by alternately depositing thin films of Mo and Si using DC sputtering and RF sputtering, respectively. The present invention allowed precise scanning of an optical substrate over a Gaussian-shaped deposition profile to produce extremely flat, smooth, and thin coatings which were appropriate for a flat mirror. The results from the set of flat mirrors fabricated—EUV7, EUV8, EUV9—demonstrate that the present invention offers excellent lateral and vertical thickness control for coating mirrors as shown in FIG. 10.

TABLE II

Deposition parameters for Mo/Si multi-layer (20 periods) mirrors for use at 13.4-nm.

|  | EUV7 | EUV8 | EUV9 |
|---|---|---|---|
| Chamber pressure (mTorr) | 6.35 | 6.35 | 6.35 |
| Si deposition rate (nm/min) | 7.50 | 7.50 | 7.50 |
| Si RF deposition power (W) | 102 | 102 | 102 |
| Mo deposition rate (nm/min) | 7.20 | 7.20 | 6.00 |
| Mo DC deposition current (amp) | 0.03 | 0.03 | 0.026 |
| Si thickness (nm) (per layer) | 2.80 | 4.50 | 4.00 |
| Mo thickness (nm) (per layer) | 2.80 | 2.80 | 2.80 |

Substrate spin rate = 10 rpm
Source-to-substrate distance = 4-cm
Ar pressure = 3.30 mTorr Stacks of 20 bi-layers were deposited and exhibited good reflectivity when analyzed using an X-ray reflectometer at 1.54 Å as shown in FIG. 10. The fact that the intensity of the first Bragg peak (B1) is approximately equal to that of the total external (TE) reflection edge for all samples (EUV7, EUV8, and EUV9) indicates that these mirrors offer near-maximum reflectance values. In addition, the positions of the Bragg peaks indicate that these mirrors are close to having the prescribed stack structure. The data for EUV7 indicates that the Mo layers were approximately 2.8-nm thick, while the Si layers were approximately 2.8-nm thick. Subsequent mirrors (EUV8 and EUV9) were deposited with thicker Si layers in order to approach the desired multi-layer coating design. The relative position of the resultant Bragg peaks indicates excellent control over the thicknesses within the stack structure. Note that the data of FIG. 10 illustrate a decoupling in signals (splitting of peaks) at Bragg peaks B3, B4, B5, and B6 for EUV8, and at Bragg peaks B2, B3, B4, and B5 for EUV9 between the stacks of Mo and Si layers. The decoupling suggests unstable deposition rates using RF sputtering. DC sputtering of both Si and Mo results in more stable deposition rates and repeatable layer thicknesses. In addition, modeling of the data in FIG. 10 indicates that the multi-layered structures had very smooth interfaces, about 5 Å rms roughness, which is comparable to that of the substrate. The results from EUV7, EUV8, and EUV9 mirror fabrication demonstrate the excellent lateral and vertical thickness control of the present invention for coating EUV optics. The present inventor was able to precisely scan the substrate over a Gaussian-shaped deposition profile to produce extremely flat, smooth, and thin coatings. The results achieved for the flat optics are extended to coat figured EUV optics with the necessary vertical and lateral thickness control.

The present invention avoids a number of problems associated with shadow masks used in other coating technologies. The geometry of the shadow mask must be determined empirically, which is a tedious and iterative calibration process. In addition, an accumulation of thin film materials on the shadow mask can change the effective geometry and change the deposition profile across a figured optic over time. The present invention, on the other hand, offers a predictable and completely repeatable coating process in which the deposition profile can be modeled a priori and directly fabricated via a comprehensive computer program. The ability of the present invention to measure the deposition rates in situ and utilize the measurements in a predictive modeling and deposition computer program makes the technology superior to other deposition schemes.

A high-precision thin film deposition method can have a significant impact on EUV applications. The present invention is expected to find use in a wide variety of cases where EUV wavelengths are of interest. Examples include, but are not limited to, EUV photolithography—shorter wavelength radiation increases resolution and results in more products/ area, lower operating voltages, and higher performance; EUV and X-ray microscopes—increases contrast at specific wavelengths, EUV telescopes—observations at new wavelengths increases the amount of information regarding interstellar materials and phenomena, EUV spectrometers—analysis using new wavelengths enables characterization of higher energy transitions, EUV and X-ray laser cavities—sources of shorter wavelength radiation for these and other short wavelength applications, etc. Each of these applications requires the fabrication of precisely coated reflective mirrors designed for use at very short wavelengths.

Other variations and modifications of the present invention will be apparent to those of skill in the art, and it is the intent of the appended claims that such variations and modifications be covered. The particular values and configurations discussed above can be varied and are cited merely to illustrate a particular embodiment of the present invention and are not intended to limit the scope of the invention. It is contemplated that the use of the present invention can involve components having different characteristics as long as the principle, the presentation of a deposition technique that enables. fabrication of high-reflectance, multi-layered mirrors with the precise thickness control and repeatability necessary for EUV applications, is followed. It is intended that the scope of the present invention be defined by the claims appended hereto.

I claim:

1. A method for fabricating high-precision thin film coatings for multi-layered mirrors in a deposition chamber for use with a light source at a desired wavelength of operation, comprising the steps of:

selecting a first target material and a second target material to be deposited on at least one optical substrate, each of the first and second target materials having a suitable refractive index N at the desired wavelength of operation, the refractive index N being defined by N=n+ik, where n is a real component, i is the square root of negative one, and k is an imaginary component;

calibrating the thickness deposition profiles for the first target material and the second target material;

modeling a desired thickness deposition profile for the first target material and the second target material; and depositing a plurality of layers of a first thin film layer of the first target material and a second thin film layer of the second target material on the at least one optical substrate to produce at least one multi-layered mirror, the plurality of layers of the first thin film layer and the second thin film layer being deposited at a predetermined pressure, the plurality of layers of the first thin film layer and the second thin film layer having a predetermined number, thickness, and thickness gradient, wherein the predetermined thickness gradient is determined using a thin film coating design program that optimizes reflectance by maintaining a constant optical phase shift for each of the first thin film layer and the second thin film layer, wherein the optical phase shift is determined by $\delta = (4\pi d N \cos\theta)/(\lambda) \pm \pi$, where $\theta$ is the optical phase shift, d is the thickness of each of the first thin film layer and the second thin film layer, N is the refractive index of each of the first thin film layer and the second thin film layer, $\lambda$ is the desired wavelength of operation, and $\theta$ is the angle of incidence of incoming light from the light source relative to the normal.

2. The method of claim 1, wherein the at least one optical substrate is non-flat.

3. The method of claim 1, wherein the at least one optical substrate is flat.

4. The method of claim 1, further comprising the step of controlling the lateral and vertical thickness of each of the first thin film layer and the second thin film layer of the plurality of layers by scanning the position of the at least one optical substrate with respect to a sputter target during deposition.

5. The method of claim 1, further comprising the step of:

performing an adequate pre-sputter of the first target material and the second target material at a predetermined pressure to remove impurities from the surfaces of the first target material and the second target material.

6. The method of claim 5, wherein said step of performing the adequate pre-sputter and said step of depositing a plurality of layers are performed using DC sputtering power for the first target material and the second target material.

7. The method of claim 6, wherein the DC sputtering power is pulsed-DC sputtering power.

8. The method of claim 1, wherein said step of depositing a plurality of layers comprises the steps of:

sputter depositing the first thin film layer and the second thin film layer;

measuring actual thickness and uniformity of the first thin film layer and the second thin film layer;

comparing actual thickness of the first thin film layer and the second thin film layer to the desired thickness of the first thin film layer and the second thin film layer; and determining and implementing a scale factor for subsequent depositions.

9. The method of claim 1, wherein the first thin film layer and the second thin film layer are alternately deposited.

10. The method of claim 9, wherein the first thin film layer is silicon.

11. The method of claim 10, wherein the second thin film layer is molybdenum.

12. The method of claim 1, wherein the second target material is selected from the group consisting of Mo, $Al_2O_3$, and combinations thereof.

13. The method of claim 1, wherein the first target material is selected from the group consisting of Si, $SiO_2$, $MgF_2$, $CaF_2$, Be, B, C, $B_4C$, and combinations thereof.

14. The method of claim 1, further comprising the step of determining an optimum deposition pressure for the deposition chamber.

15. The method of claim 14, further comprising the step of determining an optimum deposition rate.

16. The method of claim 15, further comprising the step of determining an optimum deposition profile of the first target material and the second target material.

17. The method of claim 16, wherein said step of modeling comprises the step of:

accounting for a predetermined thickness gradient of the first thin film layer and the second thin film layer.

18. The method of claim 1, further comprising the step of accounting for a $1/R^2$ dependence of the deposition rate, where R is the normal distance from a target to the at least one optical substrate at any given point on the optical substrate, and for dependence of deposition rate on a plasma geometry at a plurality of points along the at least one optical substrate, the plasma geometry changing in response to the shape of the at least one optical substrate.

19. The method of claim 1, wherein said step of depositing comprises the step of using a computer-based calibration, modeling, and deposition program.

20. The method of claim 1, further comprising the steps of:

using X-ray reflectometry at a predetermined wavelength to obtain a plurality of results and modeling the plurality of results to determine a bi-layer period, a thickness of each of the plurality of layers, and an interfacial roughness and to enable detection of a decoupled signal that results from variations in the thickness of each of the plurality of layers;

determining the thickness of the plurality of layers at a plurality of points on the at least one optical substrate to assess thickness gradient accuracy;

optimizing deposition times and deposition profiles that are used to deposit the plurality of layers in said step of depositing; and measuring an ultimate reflectance of the at least one multi-layered mirror using the light source at the desired wavelength of operation.

21. The method of claim 20, wherein the light source is a synchrotron radiation source.

22. The method of claim 20, wherein the light source is a laser plasma source.

23. The method of claim 20, wherein the desired wavelength of operation is 13.4-nm.

24. The method of claim 20, wherein the desired wavelength of operation is 193-nm.

25. The method of claim 20, wherein the desired wavelength of operation is 248-nm.

26. The method of claim 1, further comprising the step of positioning a stationary circular aperture in-between the light source and the at least one optical substrate to restrict the lateral extent of a desired deposition profile.

27. The method of claim 1, wherein the desired wavelength of operation is greater than 150-nm, the first target material being selected such that the real component n of the refractive index N of the first target material has a lower value than the real component of the refractive index of the second target material.

28. The method of claim 1, wherein the desired wavelength of operation is less than 150-nm, the first target material being seleceted such that the imaginary component k of the first target material has a lower value than the imaginary component k of the second target material.

* * * * *